(12) United States Patent
Lytle et al.

(10) Patent No.: US 7,802,359 B2
(45) Date of Patent: Sep. 28, 2010

(54) ELECTRONIC ASSEMBLY MANUFACTURING METHOD

(75) Inventors: William H. Lytle, Chandler, AZ (US);
Craig S. Amrine, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 311 days.

(21) Appl. No.: 11/965,519

(22) Filed: Dec. 27, 2007

(65) Prior Publication Data
US 2009/0165293 A1 Jul. 2, 2009

(51) Int. Cl.
H05K 3/36 (2006.01)
(52) U.S. Cl. ............................. 29/830; 29/825; 29/832; 156/584; 269/903
(58) Field of Classification Search .................. 29/825, 29/830, 832; 156/584; 269/903
See application file for complete search history.

(56) References Cited

U.S. PATENT DOCUMENTS

| | | | |
|---|---|---|---|
| 5,268,065 A | 12/1993 | Grupen-Shemansky | |
| 5,292,686 A * | 3/1994 | Riley et al. | ......... 438/605 |
| 5,759,874 A | 6/1998 | Okawa | |
| 6,001,888 A | 12/1999 | Friebe et al. | |
| 6,076,585 A * | 6/2000 | Klingbeil et al. | ........ 156/584 |
| 6,554,949 B2 * | 4/2003 | De et al. | .............. 156/344 |
| 6,652,665 B1 | 11/2003 | Sachdev et al. | |
| 6,793,741 B2 | 9/2004 | Haas et al. | |
| 6,869,894 B2 | 3/2005 | Moore | |
| 6,946,037 B2 | 9/2005 | Serve et al. | |
| 7,015,075 B2 | 3/2006 | Fay et al. | |
| 7,083,684 B2 | 8/2006 | Fukuda et al. | |
| 7,098,152 B2 | 8/2006 | Moore | |
| 2005/0009366 A1 | 1/2005 | Moore | |
| 2006/0128066 A1 * | 6/2006 | Lytle et al. | ........... 438/118 |
| 2006/0252231 A1 | 11/2006 | Moore et al. | |

FOREIGN PATENT DOCUMENTS

JP  2001-144037  5/2001

OTHER PUBLICATIONS

International Search Report and Written Opinion correlating to PCT/US2008/084268 dated Jun. 2, 2009.

* cited by examiner

Primary Examiner—C. J Arbes
(74) Attorney, Agent, or Firm—Ingrassia, Fisher & Lorenz, P.C.

(57) ABSTRACT

A method is described for manufacturing electronic assemblies (52). Electronic die (36) held in a plastic matrix (43) form a partially completed panel (35) of electronic assemblies (52). The panel (35) is adhesively mounted to a ceramic carrier (20) having multiple holes (22) there through. Conductive interconnects (38-1, 38-2, etc.) and other layers are applied to the panel, coupled to electrical contacts on the die (36) and external electrical contacts (39-1) for the panel (50). The panel (50) and the carrier (20) are separated and the panel singulated to release the finished electronic assemblies (52). Silicone is a preferred adhesive (27) and is dissolved using a non-polar solvent (70) that penetrates through the holes (22) in the carrier (20) to the adhesive (27). The adhesive (27) is preferentially applied using a transfer adhesive sandwich (24), that is, an adhesive layer (27) with removable plastic sheets (25, 26) on either side that can be peeled away from the adhesive (27). This facilitates handling and properly locating the adhesive (27) on the carrier (20) for efficient low cost manufacture of the assemblies (52).

19 Claims, 6 Drawing Sheets

ELECTRONIC ASSEMBLY MANUFACTURING METHOD

TECHNICAL FIELD

The present generally relates to integrated electronic assemblies and, more particularly, relates to a method for forming an electronic assembly incorporating multiple electronic die and interconnections thereto.

BACKGROUND

Modular electronic assemblies containing interconnected semiconductor (SC) die and other electronic components are much used. It is important that such assemblies be small in size, yet have good electrical and thermal properties and be able to incorporate various types of semiconductor die and other electronic components. Such assemblies are used when it is not practical or possible to incorporate all of the desired circuitry in a single semiconductor integrated circuit (IC). In such assemblies, several different types of IC's and other semiconductor devices may need to be housed and interconnected in the desired configuration. In order to save space and improve the overall properties of the assembly it is useful to mount unpackaged semiconductor die within the assembly and then interconnect them to provide the desired overall electrical function. The overall cost of such assemblies is a sensitive function of the manufacturing methods used in their fabrication and the batch size, that is, the number of such assemblies that can be fabricated simultaneously. The small size and fragility of unpackaged semiconductor die and other unpackaged components adds to the difficulty of manufacturing assemblies using unpackaged die, especially where the dimensions of the assemblies (e.g., area and thickness) must be minimized. For example, in consumer electronic products such as cellular telephones and personal digital assistants (PDAs), the electronic assemblies providing the desired functionality must be as thin and as small as possible so that the outer dimensions of the device, especially the thickness may be minimized. Further, while such assemblies can often be readily fabricated on a laboratory scale, scaling up the manufacturing process for high volume and low cost can present significant challenges. Accordingly, there is an ongoing need for volume manufacturing methods capable of efficiently providing compact electronic assemblies with good thermal properties and low connection impedance for attachment to the circuit motherboard or tape of the finished product.

Accordingly, it is desirable to provide an improved method of manufacture of electronic assemblies that permits use of multiple interconnect layers and multiple electronic components when needed, and at the same time, that is adapted for volume manufacture. It is further desirable that the manufacturing methods and materials employed be compatible with present day manufacturing capabilities and materials, and not require substantial modifications of available manufacturing procedures or significant increase in occupied area or other increase in manufacturing costs. It is further desirable that the overall thickness and lateral area of the assembly be minimized. Other desirable features and characteristics of the present invention will become apparent from the subsequent detailed description and the appended claims, taken in conjunction with the accompanying drawing and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

Figure 1:
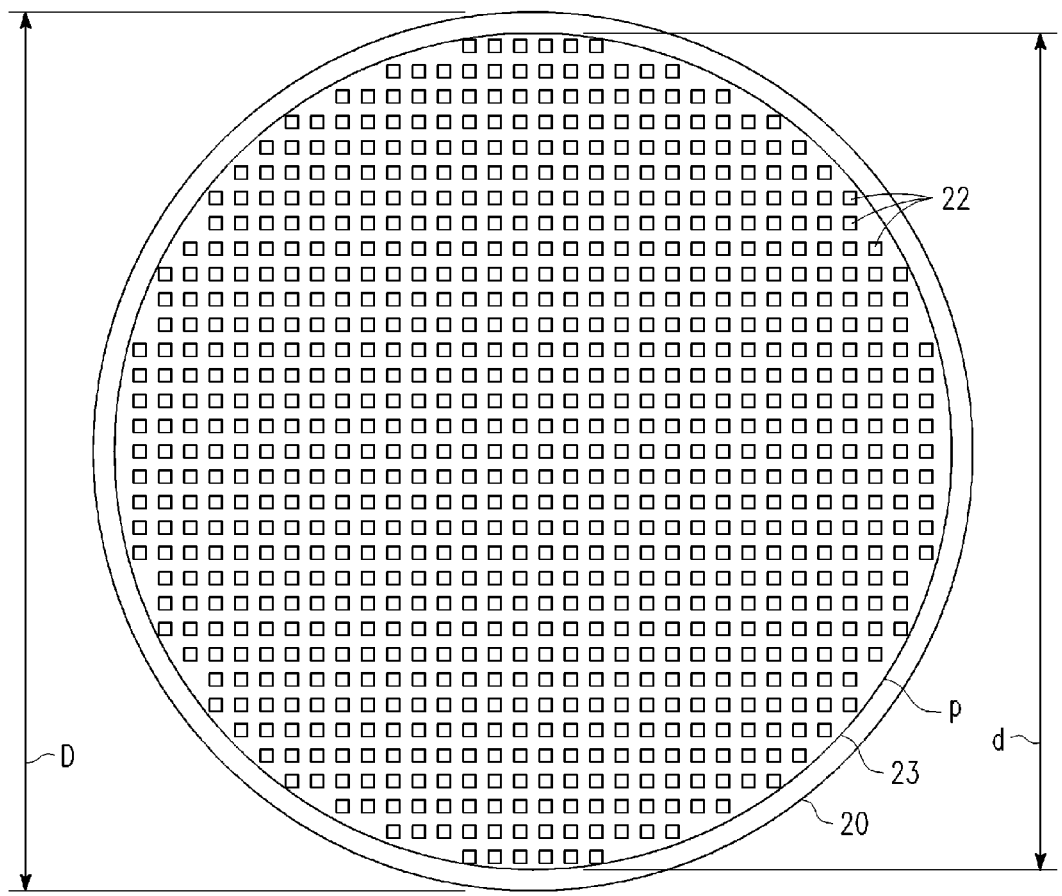
FIG. 1 is a simplified plan view and FIG. 2 is a simplified schematic cross-sectional view through a ceramic carrier suitable for use as a temporary substrate during the manufacture of an array of electronic assemblies, according to an embodiment of the present invention.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction and method of fabrication, and descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of use in sequences other than those illustrated or otherwise described herein. Furthermore, the terms "comprise," "include," "have" and any variations thereof, are intended to cove non-exclusive inclusions, such that a process, method, article, or apparatus that comprises a list of elements is not necessarily limited to those elements, but may include other elements not expressly listed or inherent to such process, method, article, or apparatus. The terms "left," "right," "in," "out," "back," "up," "down," "top," "bottom," "over," "under," "above," "below" and the like in the description and the claims, if any, are used for describing relative positions and not necessarily for describing permanent positions in space. It is to be understood that the embodiments of the invention described herein may be used, for example, in other orientations than those illustrated or otherwise described herein. The tern "coupled," as used herein, is defined as directly or indirectly connected in an electrical or non-electrical manner. Further, as used herein the word "die" is intended to include various chip-from electronic components, referring to both singular and plural.

The efficient, low cost manufacture of compact electronic assemblies generally requires that they be made in the form of a panel containing multiple individual assemblies, which, after completion, are separated ("singulated") into the individual assemblies. It is generally also the case that the relatively fragile electronic die and other electronic components that are included in the assembly be fixed in their desired relative location at an early stage of manufacturing and then electrically interconnected into the final circuit configuration, as for example, by one or more levels of conductors separated by dielectrics. The conductor-dielectric insulator sandwiches are referred to as an "interconnect layer". Several interconnect layers may be needed depending upon the complexity of the electronic assembly. External electrical contacts must also be provided on the finished assembly so that it can be connected to the terminals of a motherboard of other higher-level electronic apparatus of which it is a part. During the course of manufacturing the panel containing the multiple electronic assemblies, various deposition and curing steps are often employed that require that the partially completed panel and its handling system withstand elevated temperatures, as for example, up to ~250 degrees Celsius. Since the finished panels and assemblies must be comparatively thin, it is necessary to support them on a temporary carrier during manufacture. The adhesive used to attach an embryonic pane to the carrier must b sufficiently robust to withstand mechanical handling of the carrier-panel combination during subsequent manufacturing steps without failure, must be stable during the high temperature excursions occurring during various processing steps, and still be able to be removed so that the finished panel can be separated from the temporary carrier near the end of the manufacturing cycle. In addition, the selection of adhesive and the adhesive attachment and removal processes must not adversely affect the panel and its interconnect layers, electrical connection pads, solder coatings, encapsulations, and the like. Accordingly, the design of the supporting carrier, selection of the adhesive, and the manufacturing steps by which the embryonic panel is formed thereon, brought to completion and later separated therefrom by detaching it from the adhesive, involve a complex set of trade-offs in order to arrive at an efficient and low cost manufacturing method for the panels. The combination of carrier design, adhesive selection, application and removal and intermediate manufacturing steps are described below.

Figure 2:
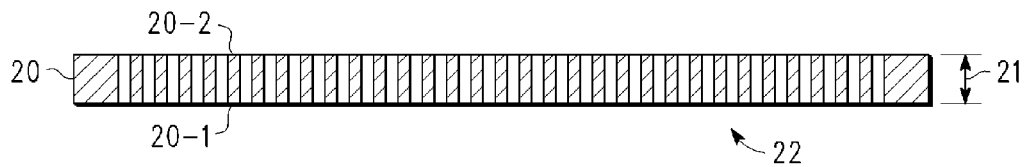

FIG. 1 is a simplified plan view and FIG. 2 is a simplified schematic cross-sectional view through ceramic carrier 20 suitable for use as a temporary substrate during the manufacture of an array of electronic assemblies, e.g., a "panel", according to an embodiment of the present invention. Carrier 20 is conveniently of alumina ceramic but other ceramics and other refractory materials may also be used. Alumina is preferred because it is a comparatively inexpensive material, can be readily fabricated at low cost with a large number of holes 22 extending there-through, is substantially inert to the various heat treatments, solvents and other chemicals and processes used in later fabrication steps and is sufficiently stiff so as to provide a substantially planar surface on which the assembly can be built-up without significant warpage due to differential expansion and contraction of the array of assemblies being formed on carrier 20. The importance of the large number of holes 22 is explained in connection with FIGS. 14-15. Thickness 21 is typically about 1 mm but thicker or thinner carriers may be used depending upon the lateral dimensions and material of the carrier. It is desirable that lateral dimension (e.g., diameter) D of carrier 20 is at least equal to the lateral dimension of the panel being fabricated thereon. Since the number of assemblies that can be fabricated at the same time, and hence the manufacturing efficiency, depends on the lateral dimensions of the pane and carrier 20, it is desirable that the panel and carrier be as large as can be conveniently and safely handled in m manufacturing. Carrier 20 is shown as being circular, and this is preferred since it is convenient for other fabrication steps later in the process, but it is not essential. As used here, references to "diameter" D or d are intended to include the principal dimensions of non-circular shapes and not be limited to merely circular shapes. Other lateral shapes can also be used and the present invention does not depend upon the lateral shape of carrier 20. For a 1 mm thick panel, the size of holes 22 is desirably about 1 mm to 10 mm in lateral dimension and, more conveniently about 1 to 5 mm and preferably about 1 to 2 mm, but larger or smaller holes and spacings can also be used depending upon the diameter and thickness of carrier 20. Stated another way, the lateral size holes 22 is desirably at least as large as thickness 21 of carrier 20. The lateral center-to-center spacing of holes 22 is usefully about 2 to 7 times the hole size, more conveniently about 3 to 6 times and preferably about 5 times the hole size. In the test carrier used, the hold size was 1.27 mm and the center-to-center spacing was 6.35 mm or about 5 times the hole size. For square holes, this amounts to about 4% of the panel area within diameter d and for circular holes about 3% of the panel area within diameter d. Stated another way, it is desirable that holes 22 be uniformly distributed and 2 to 10% of the carrier area within diameter d, more conveniently about 2 to 7% and preferably about 3 to 5%. Circle or periphery 23 of lateral dimension d and perimeter p desirably lies just outside the pattern of holes 22 and corresponds to the lateral extent (e.g., dimension d) of transfer adhesive 27 of FIG. 3. Holes 22 extend through carrier 20 between its major faces 20-1 and 20-2. It is desirable that one or both major surfaces or faces 20-1 or 20-2 or carrier 20 is ground or lapped substantially flat but that is not essential. Carrier 20 has a rim (without holes) of width (D-d)/2 lying outside of perimeter p. It is desirable that rim width (D-d)/2 be about 3 -10 times the panel thickness, more conveniently about 4 to 8 times and preferably about 5 times that panel thickness. Stated another way, it is important that the percentage hole area and rim width be chosen so that the percentage hole area is as large as possible while still providing a panel of sufficient stiffness to remain substantially flat during processing and sufficiently strong to withstand the necessary handling during manufacturing without breaking.

Figure 10:
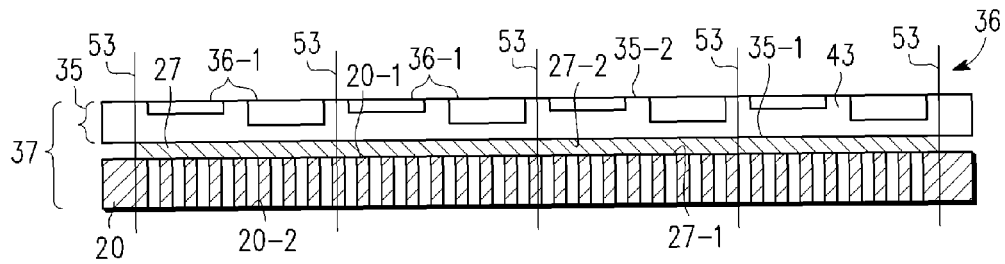
Figure 11:
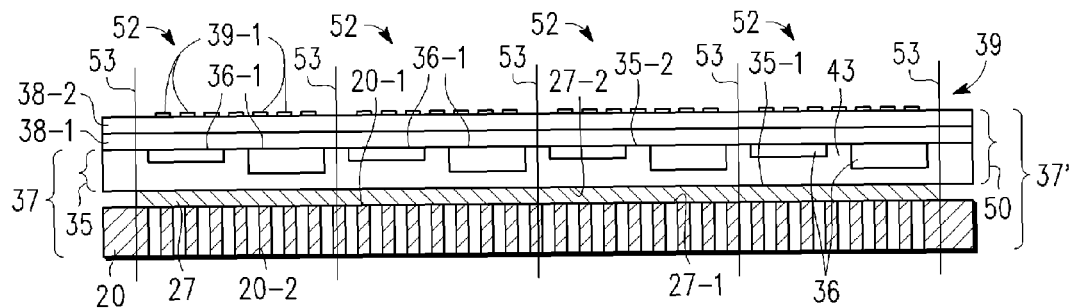
Figure 12:
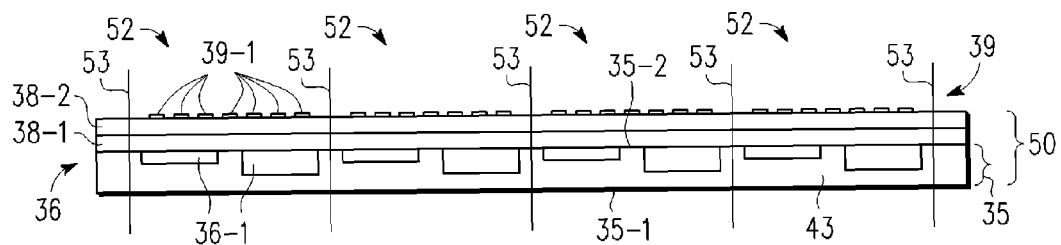

FIGS. 3-12 are simplified schematic cross-sectional view at different stages 40-1 through 40-10 of manufacture illustrating how array panel 50 of individual electronic assemblies 52 of FIG. 12 is fabricated using support carrier 20 of FIGS. 1-2, according to further embodiments of the present invention. The general manufacturing procedure is to attach an embryonic assemblies panel (e.g., panel 35 of FIG. 9) to carrier 20 with an adhesive. Panel 35 is referred to as an "embryonic panel" because it has not yet completed manufacturing. In other words, panel 35 is an early stage panel or partially completed panel. Embryonic or partially completed panel 35 contains the die needed for the electrical function of the desired assemblies, held together by a mod compound.

The combination of the embryonic panel 35 and carrier 20 are further processed to provide the desired electrical interconnections among the die and the desired external electrical contacts until the panel is finished. The finished pane is then separated from the carrier and singulated into the individual electrical assemblies. While a large number of potential adhesives exist, it has been found that only a limited number have the right combination of adhesive properties, temperature stability, non-interference with other manufacturing steps and materials, and release requirements. Further, while such adhesives may be applied to and removed from the carrier by many techniques, the preferred techniques described below are well suited for low cost volume manufacturing.

Figure 3:
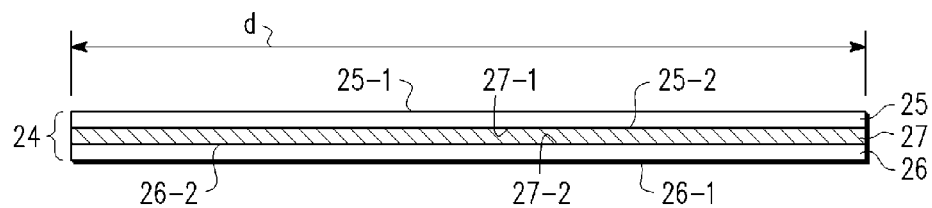
FIGS. 3-12 are simplified schematic cross-sectional views at different stages of manufacture illustrating how an array of electronic assemblies is fabricated using the support carrier of FIGS. 1 and 2, according to a further embodiment of the present invention.

Referring to manufacturing stage 40-1 of FIG. 3, transfer adhesive (TA) 24 having sandwich structure 41-1 of lateral dimension d and perimeter p is provided. TA 24 is generally a three-layer sandwich comprising upper plastic film 25 (generally referred to as the "top liner"), central adhesive layer 27, and lower plastic film 26 (generally referred to as the "bottom liner"). Plastic film or liner 25 has upper (outward facing) surface 25-1 and lower (inward facing) surface 25-2. Plastic film or liner 26 has lower (outward facing) surface 26-1 and upper (inward facing) 26-2. Liners 25, 26 are desirably of PET or other standard liner material with release coating of different surface energies so one side will peel more easily than the other, but other materials can also be used provided that they are compatible with adhesive 27 and will removably release therefrom. Adhesive layer 27 is preferably a silicone material. Other adhesive materials and application techniques can also be used provided that they are robust enough to keep the embryonic panel stuck to the carrier during subsequent manufacturing steps, can withstand the temperatures needed for later fabrication of the electronic assembly and can be dissolved or peeled away at a later stage of the manufacturing process without damage to the components and materials on the embryonic and finished panel. This is discussed in more detail in connection with FIGS. 14-15.

Adhesive layer 27 has upper surface 27-1 in contact with lower (inward facing) surface 25-2 of upper liner 25, and lower surface 27-2 in contact with upper (inward facing) surface 26-2 of lower liner 26. Inward facing surface 25-2 of top liner 25 and inward facing surface 26-2 of bottom liner 26 have been treated by their manufacturer so that they removably adhere to central adhesive layer 27. It is desirable that top and bottom liners 25, 26 have different release forces, that is, so that one liner pulls away from adhesive 27 more easily than the other. The liner with the lower release force is referred to as the "easy side" and the liner with the higher release force is referred to as the "hard side." Liners 25, 26 are desirably about 0.025 to 0.075 mm thick and adhesive layer 27 is typically about 0.025 to 0.075 mm thick, but thicker and thinner layers can also be used. The liner thickness are not critical provided that the liners can be readily removed as described in the following manufacturing stages. For the purposes of the manufacturing process described herein, it is desirable that top liner 25 be the easy side. Commercially available materials such as Gel-Pak Transfer Adhesive type GP-TA, manufactured by Gel-Pak of Hayward, California USA are suitable for TA 24. For convenience of use, it is desirable that TA 24 be marked so that the easy and hard sides can be readily identified.

Figure 4:
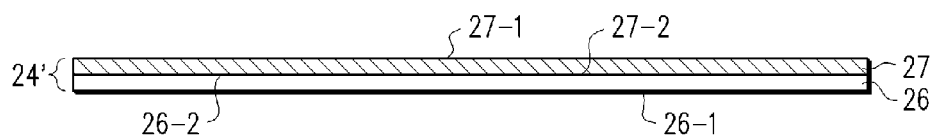
Figure 5:
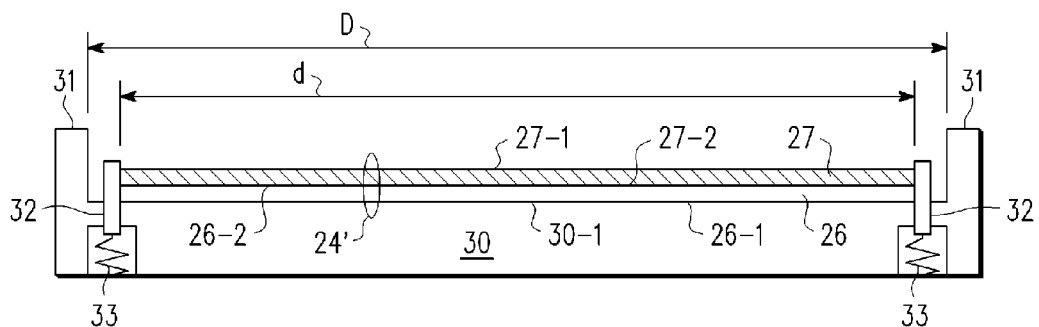
Figure 6:
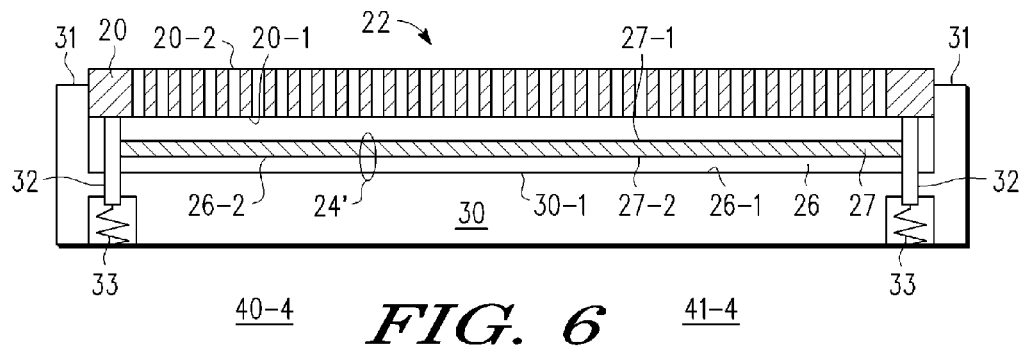
Figure 7:
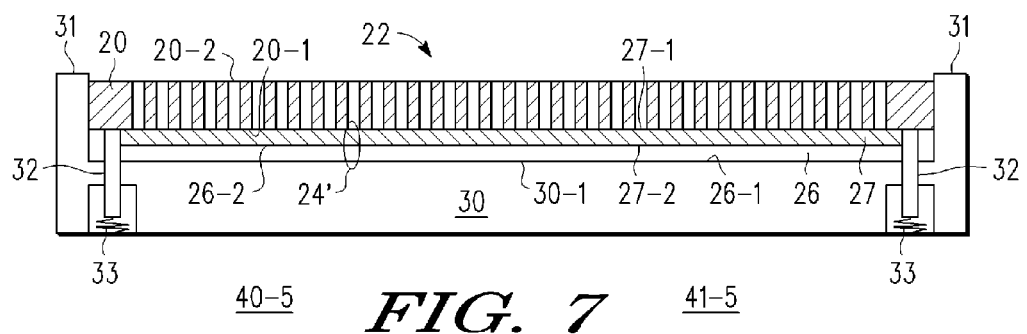

Referring now to manufacturing stage 40-2 of FIG. 4, top liner 25 is removed yielding structure 41-2. In this manner upper surface 27-1 of adhesive 27 is exposed. For convenience of description, TA 24 with top liner 25 removed is referred to as TA 24'. In manufacturing stage 40-3 of FIG. 5, TA 24' is conveniently placed in jig 30 so as to lie between retractable alignment pins 32 supported by springs 33. Alignment pins 32 are separated by dimension d plus a small clearance amount. Lower surface 26-1 of bottom liner 26 lies against upper surface 30-1 of jig 30. Upward extending rim wall or protrusions 31 separated by approximately dimension D (plus a small clearance amount) lie laterally outside pins 32. Jig 30 is designed so that TA 24' drops in place within alignment pins 32 and carrier 20 drops in place within rim wall or protrusions 31. Sufficient clearance should be provided to allow TA 24' and carrier 20 to be easily inserted in jig 30 without significant slop. TA 24' without top liner 25 is placed in jig 30 against upper surface 30-1. No adhesive is needed between lower surface 26-1 of bottom liner 26 and upper surface 30-1 of jig 30. Structure 41-3 results. Referring now to manufacturing stage 40-4 of FIG. 6, carrier 20 is placed in jig 30 within alignment rim or protrusions 31 giving structure 41-4. In manufacturing stage 40-5 of FIG. 7, carrier 20 is pressed down so that pins 32 retract against springs 33 until surface 20-1 of carrier 20 contacts surface 27-1 of adhesive 27 so that they stick together. Structure 41-5 results as long as the pressure is maintained on carrier 20. When released, springs 33 push up pins 32 raising the combination of carrier 20 and TA 24' away from surface 30-1 of jig 30. While the use of jig 30 is convenient, it is not essential and the relative location of TA 24' and carrier 20 can be determined by other means. A standard pick-and-place machine can provide the desired alignment, wherein the perimeter of TA 24' lies on or within circle or periphery 23 (see FIG. 1) of perimeter p when mated with carrier 20.

Figure 8:
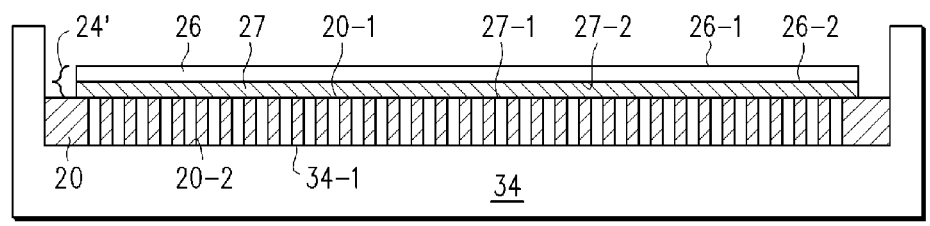

Referring now to manufacturing stage 40-6 of FIG. 8, the combination of carrier 20 and TA 24' is inverted and TA 24' desirably rolled so as to insure that surface 27-1 of adhesive 27 is firmly bonded to surface 20-1 of carrier 20. The combination of carrier 20 and TA 24' is then conveniently place in jig 34, with surface 20-2 of carrier 20 in contact with surface 34-1 of jig 34. Structure 41-6 results. Jig 34 is not essential, but is merely a convenient way of aligning carrier 20 and partially completed ("embryonic") assemblies array or panel 35 (see FIG. 9). In volume manufacturing, this can easily be accomplished by a pick-and-place machine, well known in the art. However, for convenience of explanation, use of jig 34 is assumed herein. In manufacturing stage 40-7 of FIG. 9, lower liner 26 (now facing upwards) is removed to that surface 27-2 of adhesive 27 is exposed. Then, embryonic array or panel 35 is embryonic array or panel 35 contacts surface 27-2 of adhesive 27 and removably bonds the two surfaces bond together to form temporary structure 37.

Figure 9:
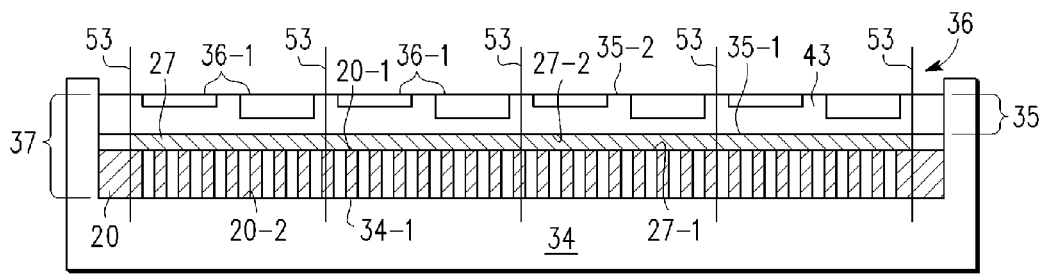

It is assumed in FIGS. 9 and following that embryonic array or panel 35 comprises semiconductor or other electronic die 36 held by their edges and rear faces in plastic encapsulation 43. Electrical contacts 36-1 of die 36 are exposed on surface 35-2 of embryonic array or panel 35. This can be accomplished in a variety of well known ways, as for example and not intended to be limiting, by placing die 36 on which electrical contacts 36-1 are located on a tensioned sticky tape, then over-molding the rear surfaces and edges of die 36 with a conventional mold compound to form plastic encapsulation 43, and then removing the tensioned sticky tape. The result of this procedure is self supporting embryonic array or panel 35 containing various die 36 with outward facing electrical contacts 36-1, arranged in groups corresponding to their desired locations in the individual electronic assemblies making up the multiple assemblies panel of array. This allows a number of individual electronic assemblies to be fabricated at the same time, thereby reducing the manufacturing cost. Vertical cut lines 53 are example of locations where array or panel 35 is eventually separated, after completion, into individual electronic assemblies. Structure 41-7 results.

Figure 13:
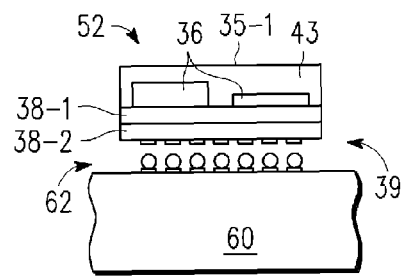
FIG. 13 is a simplified schematic cross-sectional view illustrating how an electronic assembly fabricated according to the manufacturing method illustrated in FIGS. 3-12 and then singulated can be subsequently mounted to a motherboard or other part of a finished product or higher level electronic apparatus.

In manufacturing stage 40-8 of FIG. 10, composite structure 37 comprising carrier 20 attached by adhesive 27 to embryonic array or panel 35 is removed from jig 34. This is easily accomplished since there are no adhesives between jig 34 and structure 37. Structure 41-8 results. Structure 37 is a free standing structure with array or panel 35 supported by carrier 320 so that the combination may be further processed using means well known in the art to provide finished assembly array or panel 50 of FIG. 12. In manufacturing state 400-9 of FIG. 11, one or more interconnect layer 38-1, 38-2, etc., are provided on surface 35-2 and on die 36 so as to make appropriate connection to electrical contacts 36-1 on die 36. On outer surface 39 of outermost interconnect layer, e.g., layer 38-2 in this example, electrical connection pads of contacts 39-1 are conveniently provided for making electrical connection to the individual electronic assemblies 52 in array or panel 50. Structure 41-9 results, also referred to as assembly or structure 37'. Vertical lines 53 indicate approximate cut lines for separating individual electronic assemblies 52 from assemblies array or panel 50, e.g., by sawing or other conventional means well know in the art. Referring now to manufacturing stage 40-10 of FIG. 12, carrier 20 is separated from completed assemblies pane 50 by dissolving adhesive 27, as is explained in more details in connection with FIGS. 14 and 15. Structure 41-10 results, wherein completed electronic assemblies array or panel 50 comprises individual electronic assemblies 52 still joined at cut lines 53. Individual electronic assemblies 52 are singulated, that is, separated into individual assembly's 52, using means well known in the art. Sawing is preferred. FIG. 13 is a simplified schematic cross-sectional view illustrating how individual electronic assembly 52 fabricated as described above, can be subsequently flipped over and mounted on motherboard 60 or other part of a finished product or higher level electronic apparatus, for example by means of solder balls of bumps 62 on motherboard 60. Alternatively, the solder balls or bumps may be provided on electronic assembly 52 while still in the form of array or panel 50. Either arrangement is useful.

As previously explained, array or panel 50 is stuck to carrier 20 by adhesive 27, for example, a silicone. In order to obtain freestanding assemblies array of panel 50, panel 50 and carrier 20 must be separated. In order to hold partially completed panel 35 flat during the manufacturing process leading to finished panel 50, adhesive 27 must be a robust adhesive. Otherwise the differential expansion and contraction during various temperature excursions (e.g., to ~250 degrees Celsius or higher) that occur during processing will tend to pop them apart. A further consequence of the various temperature excursions is that it often tens to make adhesive 27 stick more firmly to panel 50 and carrier 20. Thus, merely peeling them apart may result in excess breakage of panel 50. In that situation, adhesive 27 must be dissolved from between carrier 20 and surface 25-1 of panel 50 in order to separate them. While this can be done merely by placing the combination of panel 50, adhesive 27 and carrier 20 in a tank of an appropriate solvent, dissolution is generally extremely slow, especially if carrier 20 does not include holes 22, and such approach is not suitable for volume production. A further complication is that the available solvents for dissolving adhesives can also attach various parts of the finished assemblies array or panel 50, e.g., corrode various metal contacts, solder bumps, etc. This is undesirable. It was found that a specialized solvent tank system and carrier design are needed in order to be able to quickly dissolve adhesive 27 to separate panel 50 and carrier 20 and at the same time, avoid significant corrosion or other adverse affects on panel 50.

Figure 14:
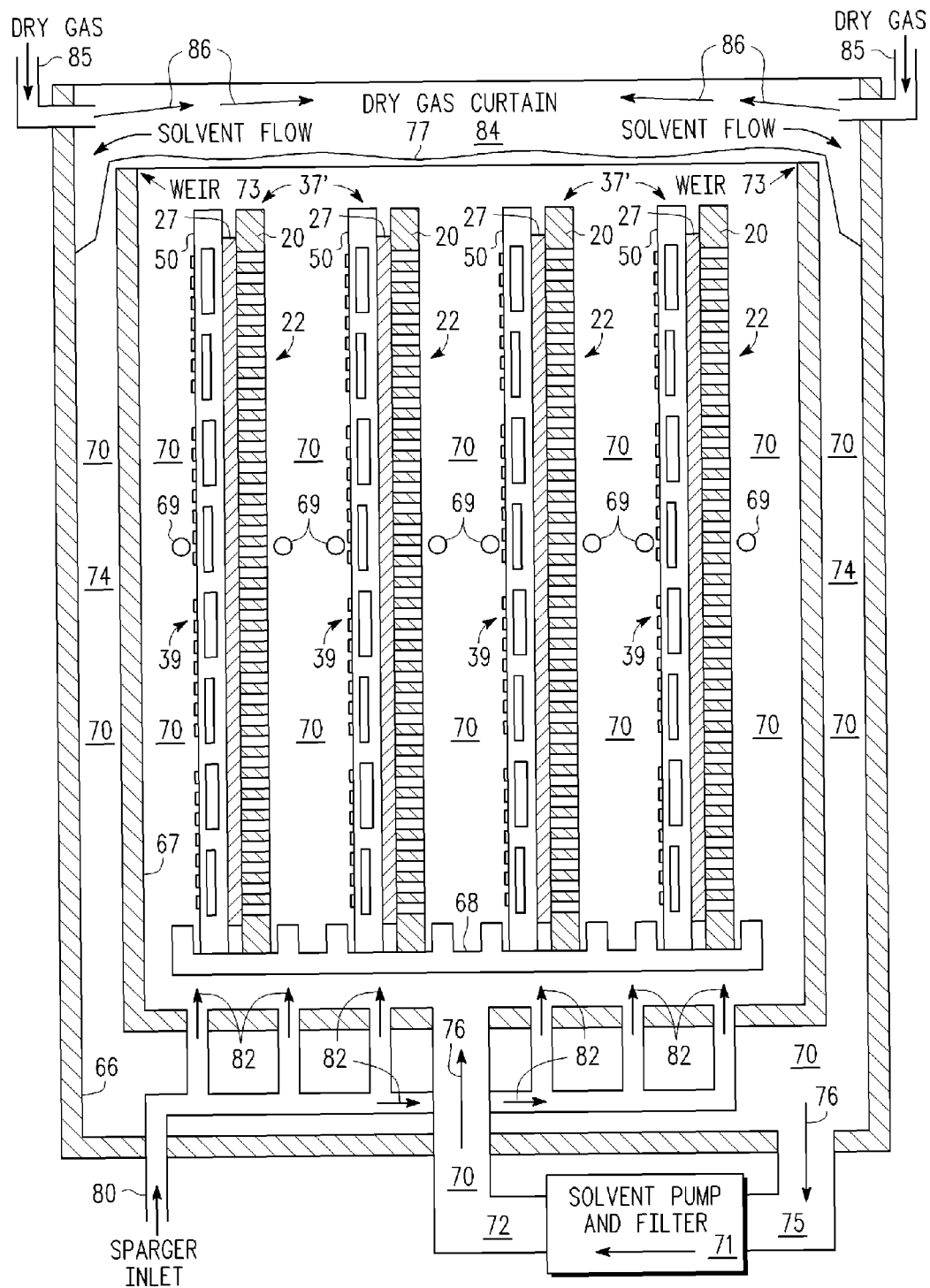
FIGS. 14 and 15 illustrate how an array of electronic assemblies prepared on the temporary carrier of FIGS. 1 and 2 according to the steps illustrated in FIGS. 3-11, is separated from such carrier to provide the structure illustrated in FIG. 12, according to a further embodiment of the present invention and showing further detail.
Figure 15:
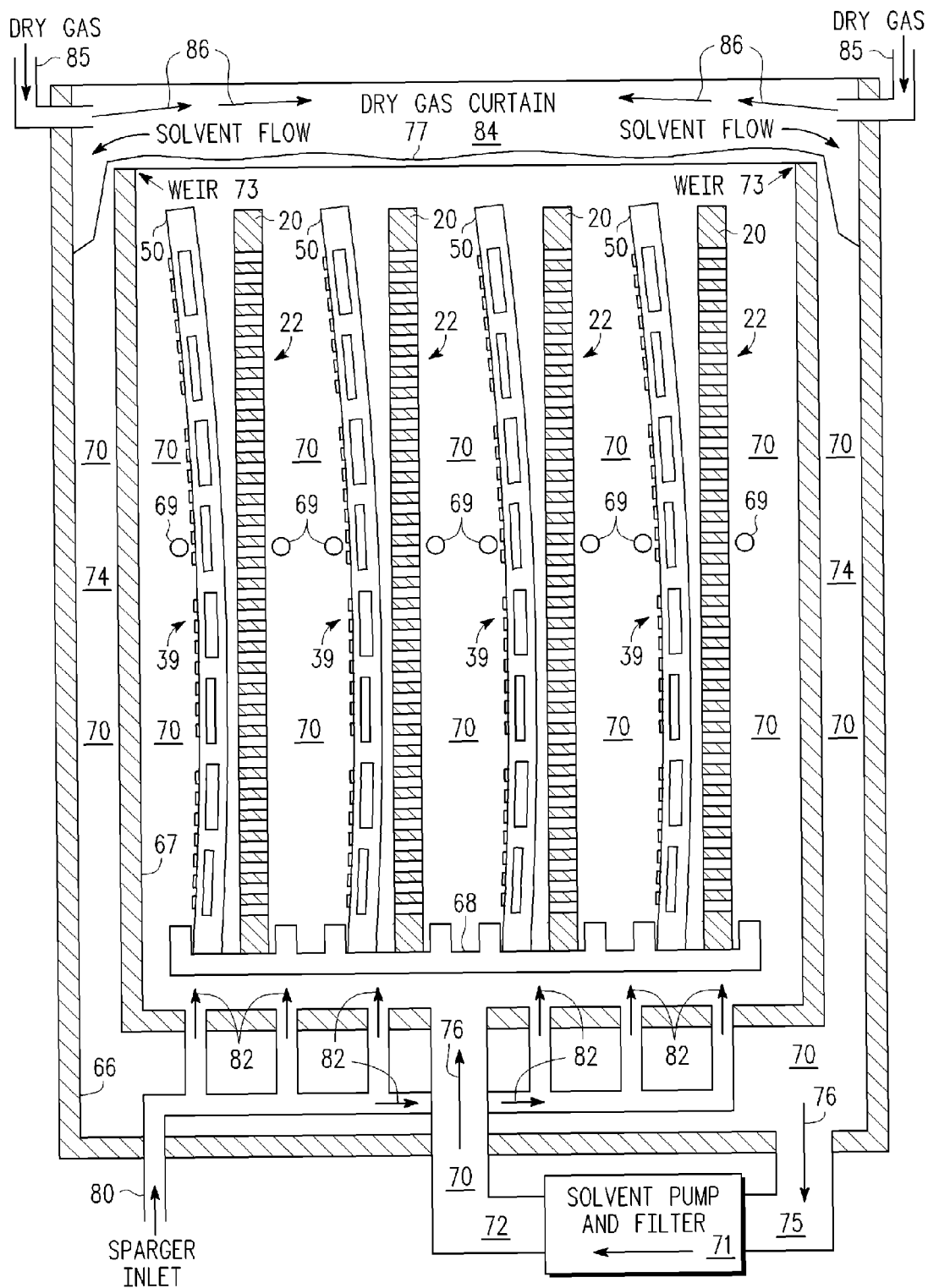

FIGS. 14 and 15 illustrate how electronic assemblies array or pane 50 of structure 37' of FIG. 11 cab be efficiently separated from carrier 20 to provide free-standing array or panel 50 illustrated in FIG. 12, and avoid undesirable corrosion effects, according to a further embodiment of the present invention and showing further detail. Referring now to FIGS. 14 and 15, solvent tank system 65 is provided, comprising outer tank 66 and inner tank 67 separated from outer tank by annual regions or space 74. Within inner tank 67 is located rack 68 for supporting composite structures 37' of FIG. 11. Structures 37' comprise panels 50 bonded to carriers 20 by adhesives 27, as shown in FIG. 14. To avoid obscuring the invention, various internal details of panels 50 have been omitted in FIGS. 14-15. In the example of FIGS. 14-15, rack 68 holds four composite structures 37' which are held in substantially vertical alignment by guides 69. Inner tank 67 and outer tank 66 contain solvent 70. Solvent re-circulating pump 71 takes suction via pipe 75 coupled to annular region or space 74 between inner tank 67 and outer tank 66 and discharges into inner tank 67 via pipe 72 so that solvent re-circulates as shown by arrows 76. A conventional temperature control mantel (not shown) surrounds outer tank 66 to maintain solvent tank system 65 at the desired temperature. Sparger inlet 80 is provided penetrating outer tank 66 and extending to various outlets in the bottom of inner tank 67 so that gasses 82 of, for example, dry air or dry nitrogen, bubble up in solvent 70 in inner tank 67, thereby providing streams of small bubbles to agitate solvent 70. Dry Nitrogen or other substantially non-reactive gas is preferred to prevent oxidation and subsequent corrosion of solder, leads or other parts of panel 50. Besides driving oxygen and/or moisture from solvent 70, the sparger system provides mechanical agitation of solvent 70 to aid in dissolving adhesive 27. Acting under the pressure created by solvent pump 71, solvent 70 fills inner tank 67 and flows up and over weir 73 formed by the upper rim of inner tank 67 into annular region or space 74, from whence it returns to pump 71. It is desirable that solvent 70 be kept as free of moisture as possible. Accordingly it is desirable to provide dry gas curtain 84 above surface 77 of solvent 70. This is conveniently accomplished by providing input pipe 85 carrying dry gas, e.g., dry air or dry nitrogen or other substantially non-reactive dry gas. blowing over solvent surface 77 as shown by arrows 86.

Important requirements for solvent 70 are that it dissolve adhesive 27, not corrode electronic contacts 39-1 on panel 50, nor attach the interlayer dielectrics and conductors of interconnect layers 38, and not attach plastic encapsulation 43 of panel 50. Thus, the initial choice of adhesive 27 must be made keeping these overall requirements in mind, that is, that adhesive 27 have the needed adhesive robustness and stability in the face of significant temperature excursions and mechanical handling, and also that there exists non-corrosive solvent 70 for adhesive 27 that is compatible with the materials of panel 50 and that will permit adhesive 27 to be later removed without adverse effect on panel 50. As noted earlier, silicone adhesives have this combination of properties, while other adhesives do not. When adhesive 27 is a silicone, solvent 70 desirably contains a sulphonic or phosphonic acid. Bothe will hydrolyze silicones, and if properly treated not significantly attach the materials of panel 50, especially electrical contacts 39-1. Sulphonic acid is preferred. A suitable form of sulphonic acid is approximately 10-30% dodecyl-benzene-sulfonic acid in a non-polar organic base solvent available from the Dynaloy Company of Indianapolis, Ind., USA. Temperature within tank 67 is desirably maintained in the range of about 25 to 60 degrees, Celsius, more conveniently in the range of about 30 to 50 degrees Celsius and preferably about 45 degrees Celsius. However Other non-polar digester solvent and other temperature ranges may also be used. It is important that solvent 70 is non-polar so as to minimize corrosion of electrical contacts 39-1 or attacking other exposed materials on panel 50. Left to itself, sulphonic acid will readily absorb moisture, rendering it undesirably polar and corrosive. Accordingly, dry gas curtain 84 is provided above surface 77 of solvent 70. Sparger gas 82 is also kept dry to inhibit moisture absorption by solvent 70.

FIG. 15 shows the results of immersing structures 37' comprising panels 50 and carriers 20 in solvent tank system 65 of FIG. 14. Numerous holes 22 in carrier 20 allow solvent 70 to reach adhesive 27 across substantially all of panel 50 and carrier 20 where adhesive 27 is located. The bubbling action of sparger gas 82 insures that there is a fresh supply of solvent into holes 22 in carrier 20. The natural stress resulting from the dissimilar materials making up carrier 20 and panels 50, cause panels 50 to bend slightly as adhesive 27 softens, thereby accelerating the release of panels 50 from carriers 20. The curvature of panels 50 has been exaggerated in FIG. 15 for clarity. Adhesive 27 dissolves away, thereby releasing panels 50 from carriers 20. Following release of panels 50, they are removed from solvent tank system 65, rinsed to remove any residual solvent, dried and then singulated into individual assemblies 52 (e.g., see FIGS. 12-13), preferably by sawing. Electronic assemblies 52 are then ready for use.

As a consequence of the manufacturing process described above, integrated 38-2 . . . etc., are generally relatively thin, the thickness of finished assemblies 52 is determined principally by the die thickness in combination with the thickness of encapsulation 43 needed to make partially completed (embryonic) assembly array or panel 35 sufficiently robust to withstand being mounted on carrier 20 and handled during manufacturing. Following panel mounting in manufacturing stages 40-7 and 40,-8 and during all subsequent manufacturing steps prior to the carrier separation stage illustrated in FIGS. 14-15, carrier 20 supports embryonic panel 35. Hence, embryonic array or panel 35 can be much thinner than if required to withstand unaided deposition of interconnect layer dielectric, etching via holes, plating the via holes with conductors and providing other metal leads associated with interconnect layers 38 and contacts 39-1. Further, the ability to provide any desired number of overlying interconnect layers makes it possible to add other die or components to upper interconnect layers, thereby reducing the lateral footprint of the finished assembly. Hence the method illustrated in FIGS. 3-12 and 14-15 is adapted to provide particularly compact electronic assemblies, made by a manufacturing process adapted to high volume low cost manufacture.

According to a first embodiment, there is provided a method for manufacturing electronic assemblies, comprising, providing a carrier having multiple holes there through, providing an embryonic panel comprising multiple partially completed electronic assemblies, coating the carrier or the embryonic panel with a removable adhesive, mounting the embryonic panel on the carrier by means of the adhesive to form a combination structure, processing the combination structure to provide a panel of finished electronic assemblies, separating the panel of finished electronic assemblies from the carrier, and singulating the panel into individual electronic assemblies. According to a further embodiment, the mounting step comprises, mounting the embryonic panel on the carrier so that the adhesive substantially overlies the multiple holes in the carrier. According to a still further embodiment, the multiple holes are substantially to a yet further embodiment, the multiple holes have a combined area comprising about 2 to 10 percent of the area on the carrier in contact with the adhesive. According to a still yet further embodiment, the carrier comprises a ceramic. According to yet still further embodiment, the carrier comprises alumina. According to another embodiment, the adhesive comprises a silicone. According to a still another embodiment, the separating step comprises dissolving the adhesive in a solvent. According to a yet another embodiment, the dissolving step comprises using a non-polar solvent. According to a still yet another embodiment, the adhesive comprises a silicone and the dissolving step employs a solvent comprising sulphonic acid, phosphonic acid or a combination thereof. According to a yet still another embodiment, the dissolving step employs a solvent comprising sulphonic acid. According to an additional embodiment, the dissolving step further comprises blowing dry gas over and through the solvent during the dissolving step. According to a still additional embodiment, the coating and mounting steps comprise, providing a transfer adhesive sandwich having first and second plastic liners separated by an adhesive, removing a first plastic liner to expose a first surface of the adhesive, placing the first surface of the adhesive against the carrier, removing the second plastic liner to expose a second surface of the adhesive, and placing the pane against the second surface of adhesive. According to a yet additional embodiment, the first placing step comprises, placing the first surface of the adhesive against the carrier so that the first surface of the adhesive substantially covers the multiple hose in the carrier.

According to a second embodiment, there is provided a method for manufacturing individual electronic assemblies, comprising, providing an embryonic pane having a first lateral extent and comprising multiple incomplete electronic assemblies, providing a ceramic carrier having a second lateral extent at least equal to the first lateral extent and multiple holes there-through substantially uniformly distributed across a third lateral extent of the carrier, coating the third lateral extent of the carrier with an adhesive, mounting the embryonic panel to the carrier using the adhesive, completing manufacture of the embryonic panel into a substantially finished panel of multiple electronic assemblies, dissolving the adhesive to separate the substantially finished panel fro the carrier, and separating the multiple electronic assemblies of the pane into the individual electronic assemblies. According to a further embodiment, the first and second lateral extents are substantially equal and the third lateral extent is smaller than the first or second lateral extents. According to a still further embodiment, the adhesive comprises a silicone and the dissolving step utilizes a substantially non-polar solvent. According to a yet further embodiment, the coating and mounting steps utilize a transfer adhesive.

According to a third embodiment, there is provided a method for manufacturing individual electronic assemblies, comprising, providing an embryonic panel having a first lateral extent and comprising multiple incomplete electronic assemblies, each comprising one or more electronic die held in a plastic matrix, wherein the die have electrical connection points exposed on a first surface of the embryonic panel, providing a ceramic carrier of diameter D of a second lateral extent at least equal to the first lateral extent and multiple holes there-through substantially uniformly distributed across a third lateral extent of diameter d smaller than the second lateral extent, so that a rim of width (D-d)/2 without holes is present at the periphery of the carrier, coating substantially the third lateral extend of diameter d with a an adhesive derived from a transfer adhesive sandwich, placing a second exposed surface of the embryonic panel opposite the first exposed surface thereof on the adhesive so that the third lateral extent is substantially centrally located within the first lateral extent, thereby forming a combination wherein the first surface and the electrical connection points thereon are exposed, adding one or more interconnect layers and external electrical contact to the first exposed surface of the embryonic panel couples to the electrical connection points on the die, thereby substantially completing manufacture of the embryonic panel into a substantially finished panel of multiple electronic assemblies, dissolving the adhesive to separate the substantially finished panel from the carrier, and separating the multiple electronic assemblies of the panel into the individual electronic assemblies. According to a further embodiment, the transfer adhesive sandwich comprises a silicone adhesive.

While a least one exemplary embodiment has been presented in the foregoing detailed description, it should be appreciated that a vast number of variations exist, especially with respect to choices of carrier 20, holes 22, adhesive 27, embryonic panels 35, subsequent interconnect layers 38, addition of further die or other components (not shown), external contacts 39-1 and other design features of panel 50 comprising electronic assemblies 52, and solvent tank system 65. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiment of exemplary embodiments. It should be understood that various changes can be made in the function and arrangement of elements without departing from the scope of the invention as set forth in the appended claims and the legal equivalents thereof.

What is claimed is:

1. A method for manufacturing electronic assemblies, comprising:
   providing a carrier having multiple holes there through;
   providing a first panel of multiple partially completed electronic assemblies;
   coating a surface of the carrier or the first panel with a removable adhesive;
   mounting the first panel on the carrier by means of the adhesive to form a combination structure that includes the first panel, the carrier, and the adhesive between the first panel and the carrier;
   processing the first panel of the combination structure to convert the first panel to a second panel of finished electronic assemblies;
   separating the second panel of finished electronic assemblies from the carrier by placing the second panel, the adhesive, and the carrier in a tank so that primary surfaces of the carrier and the second panel are held in vertical alignment, immersing the second panel, the adhesive, and the carrier in a solvent, and circulating the solvent around the second panel, the adhesive, and the carrier to dissolve the adhesive; and
   singulating the second panel into individual electronic assemblies.

2. The method of claim 1, wherein the mounting step comprises, mounting the first panel on the carrier so that the adhesive substantially overlies the multiple holes in the carrier.

3. The method of claim 2, wherein the multiple holes are substantially uniformly distributed within an area on the carrier in contact with the adhesive.

4. The method of claim 3, wherein the multiple holes have a combined area comprising about 2 to about 10 percent of the area on the carrier in contact with the adhesive.

5. The method of claim 1, wherein the carrier comprises a ceramic.

6. The method of claim 5, wherein the carrier comprises alumina.

7. The method of claim 1, wherein the adhesive comprises a silicone.

8. The method of claim 1, wherein the separating step comprises using a non-polar solvent.

9. The method of claim 8, wherein the adhesive comprises a silicone and the separating step employs a solvent comprising an acid selected from a group consisting of sulphonic acid and phosphonic acid.

10. The method of claim 1, wherein the separating step employs a solvent comprising sulphonic acid and phosphonic acid.

11. The method of claim 1, wherein the coating and mounting steps comprise:
    providing a transfer adhesive sandwich having first and second plastic liners separated by the adhesive;
    removing the first plastic liner to expose a first surface of the adhesive;
    placing the first surface of the adhesive against the carrier;
    removing the second plastic liner to expose a second surface of the adhesive; and
    placing the first panel against the second surface of the adhesive.

12. The method of claim 11, wherein the first placing step comprises, placing the first surface of the adhesive against the carrier so that the first surface of the adhesive substantially covers the multiple holes in the carrier.

13. A method for manufacturing individual electronic assemblies, comprising:
    providing a first panel having a first lateral dimension and comprising multiple incomplete electronic assemblies;
    providing a ceramic carrier having a second lateral dimension at least equal to the first lateral dimension, wherein the ceramic carrier includes multiple holes therethrough, which are substantially uniformly distributed across the carrier;
    coating a surface of the carrier with an adhesive;
    mounting the first panel to the carrier using the adhesive;
    completing manufacture of the first panel into a substantially finished panel of multiple electronic assemblies;
    dissolving the adhesive to separate the substantially finished panel from the carrier by placing the substantially finished panel, the adhesive, and the carrier in a tank so that primary surfaces of the carrier and the substantially finished panel are held in vertical alignment, immersing the substantially finished panel, the adhesive, and the carrier in a solvent, and circulating the solvent around the substantially finished panel, the adhesive, and the carrier to dissolve the adhesive; and
    separating the multiple electronic assemblies of the substantially finished panel into the individual electronic assemblies.

14. The method of claim 13, wherein the adhesive comprises a silicone and the dissolving step utilizes a substantially non-polar solvent.

15. The method of claim 13, wherein the coating and mounting steps utilize a transfer adhesive.

16. The method of claim 1, wherein separating the second panel further comprises providing a gas into the solvent, which result in streams of bubbles that agitate the solvent.

17. The method of claim 1, wherein the tank includes an inner tank configured to accept the second panel, the adhesive, and the carrier and to contain the solvent, and wherein circulating the solvent comprises circulating the solvent so that it flows over a weir formed by an upper rim of the inner tank, and wherein the method further comprises providing a dry gas curtain over a top surface of the solvent.

18. A method for manufacturing individual electronic assemblies, comprising:
- providing a first panel having a first lateral dimension and comprising multiple incomplete electronic assemblies, each comprising one or more electronic die held in a plastic matrix, wherein the die have electrical connection points exposed on a first surface of the first panel;
- providing a ceramic carrier having a second lateral dimension at least equal to the first lateral dimension, wherein the ceramic carrier includes multiple holes therethrough, which are substantially uniformly distributed across the ceramic carrier, except that the holes are not present within at a periphery of the carrier;
- coating a surface of the ceramic carrier with an adhesive derived from a transfer adhesive sandwich;
- placing a second surface of the first panel, which is opposite the first surface, on the adhesive so that the ceramic carrier is substantially centrally located with respect to the first panel, thereby forming a combination that includes the first panel, the adhesive, and the ceramic carrier, wherein the first surface of the first panel and the electrical connection points thereon are exposed;
- adding one or more interconnect layers and external electrical contacts to the first surface of the first panel, wherein the one or more interconnect layers are coupled to the electrical connection points on the die, thereby substantially completing manufacture of the first panel into a substantially finished panel of multiple electronic assemblies;
- dissolving the adhesive to separate the substantially finished panel from the carrier by placing the substantially finished panel, the adhesive, and the carrier in a tank so that primary surfaces of the carrier and the substantially finished panel are held in vertical alignment, immersing the substantially finished panel, the adhesive, and the carrier in a solvent, and circulating the solvent around the substantially finished panel, the adhesive, and the carrier to dissolve the adhesive; and
- separating the multiple electronic assemblies of the substantially finished panel into the individual electronic assemblies.

19. The method of claim 18, wherein the transfer adhesive sandwich comprises a silicone adhesive.

* * * * *